US008174076B2

(12) United States Patent
Frisina et al.

(10) Patent No.: US 8,174,076 B2
(45) Date of Patent: May 8, 2012

(54) METHOD FOR MANUFACTURING ELECTRONIC DEVICES INTEGRATED IN A SEMICONDUCTOR SUBSTRATE AND CORRESPONDING DEVICES

(75) Inventors: Ferruccio Frisina, Sant'Agata Ii Battiati (IT); Mario Giuseppe Saggio, Acicastello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/964,579

(22) Filed: Dec. 9, 2010

(65) Prior Publication Data

US 2011/0079794 A1 Apr. 7, 2011

Related U.S. Application Data

(60) Division of application No. 11/971,155, filed on Jan. 8, 2008, now Pat. No. 7,871,880, which is a continuation-in-part of application No. PCT/EP2006/006675, filed on Jul. 7, 2006.

(30) Foreign Application Priority Data

Jul. 8, 2005 (EP) ..................................... 05425495

(51) Int. Cl.
*H01L 29/66* (2006.01)
(52) U.S. Cl. .................. 257/355; 257/342; 257/E29.024
(58) Field of Classification Search .................. 257/353, 257/723, 724, 509, 342, 341, E21.066, E29.024
See application file for complete search history.

(56) References Cited

U.S. PATENT DOCUMENTS

| 5,510,281 | A | 4/1996 | Ghezzo et al. |
| 6,048,759 | A | 4/2000 | Hshieh et al. |
| 2003/0201503 | A1 | 10/2003 | Frisina |
| 2005/0139906 | A1 | 6/2005 | Magri' et al. |
| 2006/0197152 | A1 | 9/2006 | Tokano et al. |
| 2008/0185593 | A1* | 8/2008 | Saggio et al. .................... 257/77 |
| 2011/0079794 | A1* | 4/2011 | Frisina et al. .................... 257/77 |

FOREIGN PATENT DOCUMENTS
EP 1111685 A1 6/2001

OTHER PUBLICATIONS

Vathulya, V. et al., "Characterization of Inversion and Accumulation Layer Electron Transport in 4H and 6H-SiC MOSFETs on Implanted P-Type Regions," IEEE Transactions on Electron Devices 47(11):2018-2023, Nov. 2000.

* cited by examiner

*Primary Examiner* — Walter L Lindsay, Jr.
(74) *Attorney, Agent, or Firm* — Seed IP Law Group PLLC

(57) ABSTRACT

A method manufactures a vertical power MOS transistor on a semiconductor substrate comprising a first superficial semiconductor layer of a first conductivity type, comprising: forming trench regions in the first semiconductor layer, filling in said trench regions with a second semiconductor layer of a second conductivity type, to form semiconductor portions of the second conductivity type contained in the first semiconductor layer, carrying out an ion implantation of a first dopant type in the semiconductor portions for forming respective implanted body regions of said second conductivity type, carrying out an ion implantation of a second dopant type in one of the implanted body regions for forming an implanted source region of the first conductivity type inside one of the body regions, carrying out an activation thermal process of the first and second dopant types with low thermal budget suitable to complete said formation of the body and source regions.

14 Claims, 6 Drawing Sheets

METHOD FOR MANUFACTURING ELECTRONIC DEVICES INTEGRATED IN A SEMICONDUCTOR SUBSTRATE AND CORRESPONDING DEVICES

BACKGROUND

1. Technical Field

The present invention relates to a method for manufacturing electronic devices integrated on a semiconductor substrate and corresponding devices.

More specifically, the invention relates to a method for forming a power MOS transistor of the vertical type on a semiconductor substrate with wide band gap comprising a first superficial semiconductor layer with wide band gap of a first type of conductivity.

The invention also relates to a vertical power MOS device integrated on a semiconductor substrate with wide band gap comprising at least an implanted body region of a first type of conductivity, at least an implanted source region of a second type of conductivity formed inside said at least one implanted body region, a gate structure projecting from said semiconductor substrate and insulated therefrom by means of a dielectric layer.

The invention particularly, but not exclusively, relates to vertical, high voltage, multi-drain power MOS transistors and the following description is made with reference to this field of application by way of illustration only.

2. Description of the Related Art

As it is well known, silicon carbide (SiC) is a wide band gap semiconductor material, i.e., with an energetic value Eg of the band gap higher than 1.1 eV, with such physical characteristics as to make it ideal for the formation of electronic switches for power applications. In the following table some physical parameters are reported of the most common silicon carbide polytypes, in comparison with silicon (Si).

|  | Si | 3C—SiC | 6H—SiC | 4H—SiC |
|---|---|---|---|---|
| Eg (eV) | 1.1 | 2.3 | 3 | 3.3 |
| Vsn | $1 \times 10^7$ | $2.5 \times 10^7$ | $2 \times 10^7$ | $2 \times 10^7$ |
| μn (cm²/Vs) | 1350 | 1000 | 380 | 947 |
| ∈r | 11.8 | 9.66 | 9.7 | 9.7 |
| Ec (V/cm) | $2 \times 10^5$ | $3 \times 10^6$ | $4 \times 10^6$ | $3 \times 10^6$ |
| K (W/cm K) | 1.5 | 4.9 | 5 | 5 | where Eg is the energetic value of the band gap, Vsn is the saturation speed of the electrons, μn is the mobility of the electrons, ∈r is the dielectric constant, Ec is the critical electric field, and k is the thermal conductivity.

From the parameters reported in such table, it is possible to deduce that power electronic devices formed on silicon carbide substrates with respect to power electronic devices formed on silicon substrates exhibit the following advantageous characteristics:
  a low output resistance in conduction being the breakdown voltage equal (due to the high critical electric field value Ec);
  a low leakage current (due to the high band gap energetic value, Eg),
  high working temperature and high working frequencies (due to the high thermal conductivity k and saturation speed Vns values).

It is to be noted that due to the high value of the critical electric field Ec in silicon carbide semiconductor substrates with respect to silicon semiconductor substrates, it is possible to form power devices integrated on silicon carbide semiconductor substrates which can withstand high cut-off voltages with a very reduced epitaxial thickness.

For example, with reference to FIG. 1, a multi-drain MOS power device 3 is described, being formed according to the prior art and comprising a heavily doped silicon semiconductor substrate 1 of a first type of conductivity, in particular of the N+ type, whereon a semiconductor epitaxial layer 2 of the same N type is formed.

The epitaxial layer 2 forms a drain layer common by a plurality of elementary units forming the MOS power device 3. Each elementary unit comprises a body region 4 of a second type of conductivity, in particular of the P type, formed in the epitaxial layer 2.

In the epitaxial layer 2, below each body region 4, there is a column region 5 of the P type which extends downwards for the whole thickness of the epitaxial layer 2 towards the semiconductor substrate 1.

In particular, each column region 5 is aligned and in contact with a respective body region 4.

The MOS power device 3 also exhibits, outside the body regions 4, heavily doped source regions 6 of the N type.

The surface of the epitaxial layer 2 is then covered with a thin gate oxide layer 7 and with a polysilicon layer 8. Openings are thus provided in the polysilicon layer 8 and in the thin gate oxide layer 7 to uncover the surface of the epitaxial layer 2 aligned with each source region 6. An insulating layer 9 completely covers the polysilicon layer 8 and it partially covers the source regions 6, so as to enable a source metallic layer 1A to contact the source regions 6 and the body regions 4. A drain metallic layer 1B is also provided on the lower substrate of the semiconductor substrate 1.

To form a device 3 able to withstand a breakdown voltage BV equal to 600 V, a drain epitaxial layer 2 is to be provided formed in silicon with a thickness equal to 60 mm and concentration equal to $2 \times 10^{14}$ at/cm³, while if the drain epitaxial layer 2 is instead formed in silicon carbide, it can have a thickness of only 4 μm and concentration equal to $1 \times 10^{16}$ at/cm³, and thus obtaining a much more compact device 3.

Moreover in the devices 3 of the multi-drain type, the presence of the column regions 5 allows to reduce the resistivity of the epitaxial layer 2 without decreasing the breakdown voltage BV of the device 3 itself. With this type of devices 3 it is thus possible to reach a predetermined breakdown voltage BV with a resistivity of the epitaxial layer 2 lower than that used in conventional MOSFET devices, and, in consequence, to obtain power MOSFET transistors with reduced output resistance Ron.

FIGS. 2 and 3 show the trend of the electric field E in the column region 5 of type and along the drain epitaxial layer 2.

In particular, as shown in FIG. 2, with reference to line II-II of FIG. 1, it results that the trend of the electric field E is constant and equal to the value of the critical electric field Ec in correspondence with a longitudinal dimension of the column region 5 (points A and C of FIGS. 1 and 2).

Similarly it occurs that the trend of such critical electric field E is constant and equal to the value of the critical electric field Ec in correspondence with line III-III of FIG. 1, i.e., in correspondence with a transversal dimension of the device 3, both of the column regions 5 and in the drain epitaxial layer 2, this allows to obtain, being the drain layer thickness identical, a much higher breakdown voltage BV with respect to a MOS device not having the column region 5.

Moreover, it is known that the output resistance Ron is proportional to the resistivity $\rho_{epi}$, and to the thickness $th_{epi}$ of the epitaxial layer 2 while it is inversely proportional to the conduction area $A_{cond}$, which, for multi-drain transistors, is equal to the active area of the device 3 decreased by the area occupied by the column regions 5.

These three parameters, and in particular the resistivity $\rho_{epi}$, in multi-drain MOS devices 3 are lower with respect to those of conventional power devices. Therefore, the output resistance Ron of these devices 3 of the multi-drain type is lower than that of conventional power devices.

Moreover, it is well known that for forming any electronic device integrated on a silicon carbide substrate dopant elements are introduced which produce, inside the lattice matrix of the silicon carbide substrate, doped regions of the N or P type.

In particular, nitrogen (N) and phosphorus (P) introduce donors into the lattice matrix forming doped regions of the N type, while boron (B) and aluminum (Al) introduce acceptors and form doped regions of the P type.

A particularly important technological problem linked to the formation of such doped regions is that any type of dopant implanted into a silicon carbide substrate has negligible diffusion coefficient D up to temperatures in the order of 1800° C. as described in the article "Properties of Silicon Carbide" by Gary L. Harris.

In particular, at such high temperatures, nitrogen has a diffusion coefficient D in the silicon carbide equal to $5 \times 10^{-12}$ cm$^2$s$^{-1}$, oxygen has a diffusion coefficient D equal to $1.5 \times 10^{-16}$ cm$^2$s$^{-1}$ while boron has a diffusion coefficient D equal to $2.5 \times 10^{-13}$ cm$^2$s$^{-1}$.

In the silicon instead the boron has a diffusion coefficient D equal to $2.5 \times 10^{-13}$ cm$^2$s$^{-1}$ at a temperature of about 1150° C. and thus it approximately has the same diffusion with respect to a silicon carbide substrate at a much lower temperature.

The diffusion of dopant species, used for forming the doped regions for the formation of power electronic devices, is thus a problematic technical factor in case silicon carbide substrates are used.

BRIEF SUMMARY

Analyses carried out by the Applicants have highlighted that the range projected by the boron into the silicon carbide, i.e., the typical distance covered by the boron inside the silicon carbide for a determined implantation energy, increases almost linearly with the implant energy, as shown in FIG. 4.

One embodiment is a method for forming a power device integrated on a silicon carbide semiconductor substrate, having such structural characteristics as to allow to obtain electronic devices with very contained dimensions and exhibiting a very low output voltage, overcoming the limits and the drawbacks still affecting the devices formed according to the prior art.

One embodiment manufactures a power MOS transistor integrated on a wide band gap semiconductor substrate comprising body regions below which column regions are formed obtained with wide band gap semiconductor portions formed in the substrate.

Advantageously, the doped regions of the power MOS transistors are defined, in depth and concentration, by localizing dopant elements in the semiconductor substrate by means of suitable ion implants and without making use of diffusion thermal processes.

One embodiment is a method as previously indicated and defined by the characterizing part of claim 1.

One embodiment is a device as previously indicated and defined by the characterizing part of claim 13.

The characteristics and the advantages of the invention will be apparent from the following description of an embodiment thereof given by way of indicative and non limiting example with reference to the annexed drawings.

DETAILED DESCRIPTION

Figure 1:
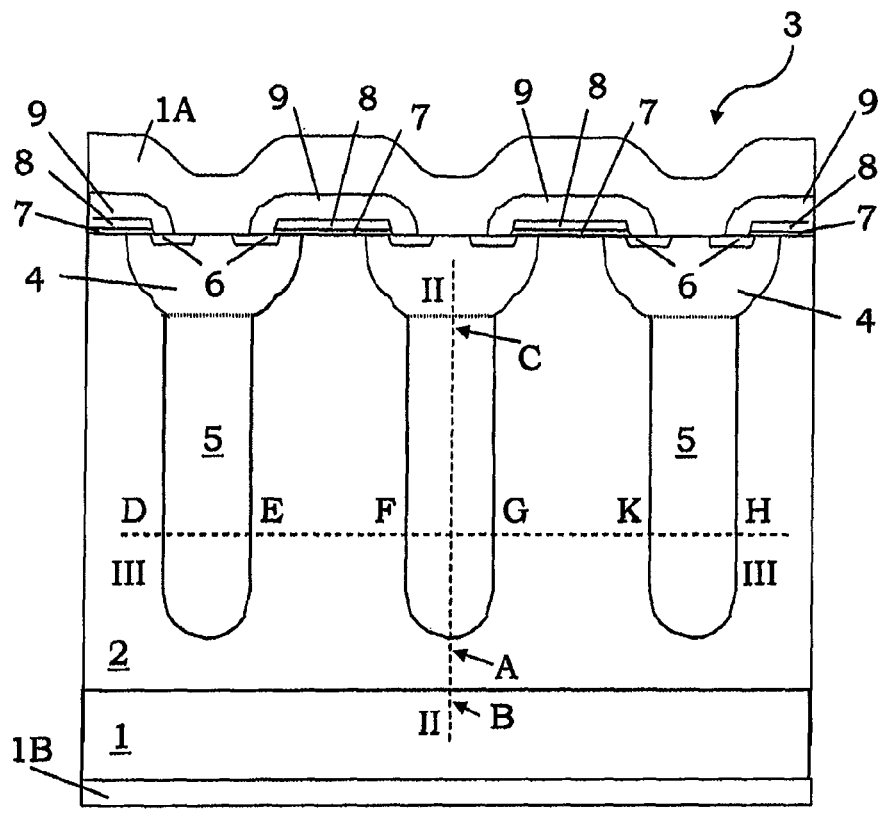
FIG. 1 shows a vertical section of a power MOSFET transistor integrated in a semiconductor substrate, formed according to the prior art.
Figure 2:
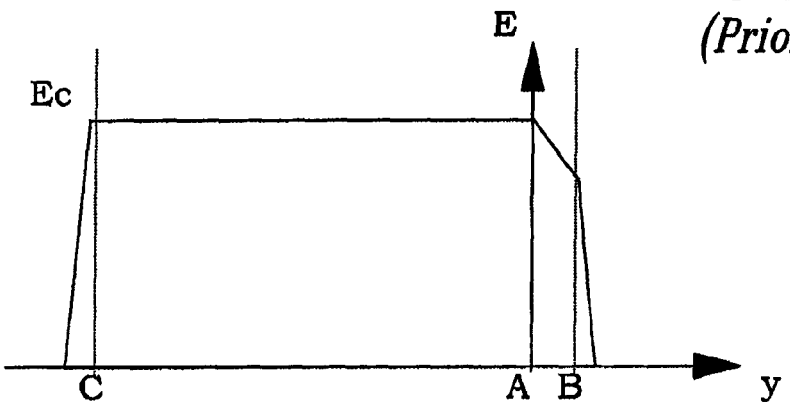
FIG. 2 shows the electric field progress along a section II-II of the device of FIG. 1.
Figure 3:
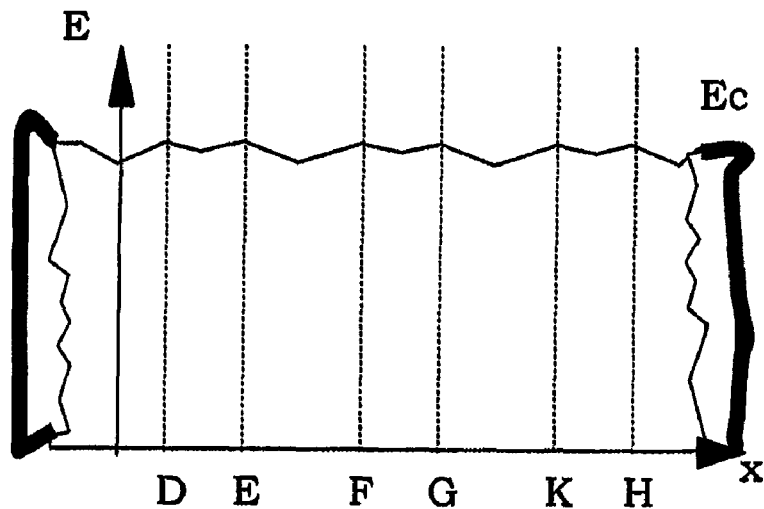
FIG. 3 shows the electric field progress along a section III-III of the device of FIG. 1.
Figure 4:
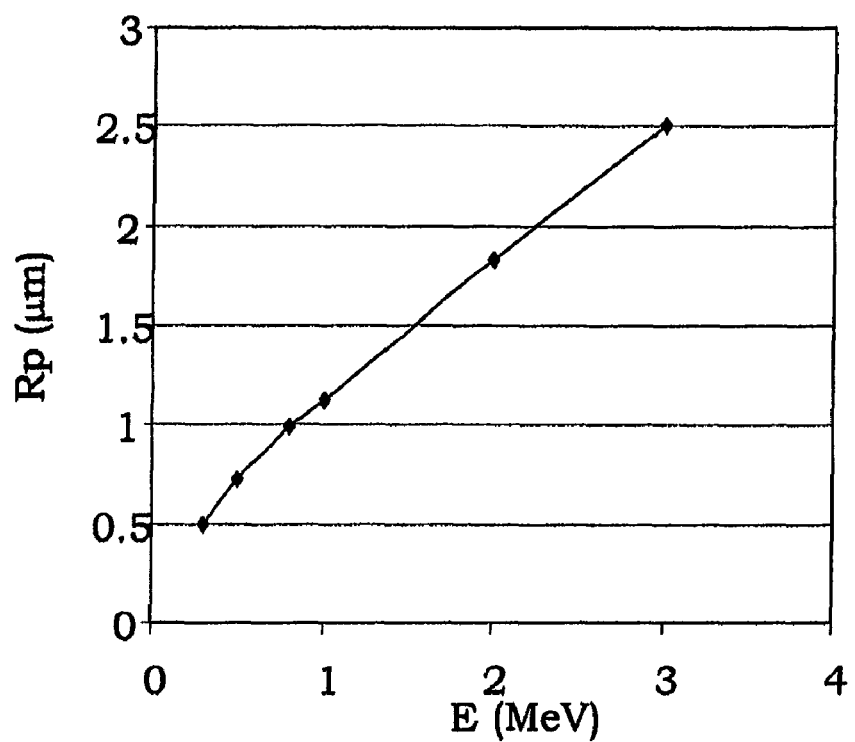
FIG. 4 shows the progress of the range projected by the boron ions in a silicon carbide semiconductor substrate when the implant energy varies.
Figure 5:
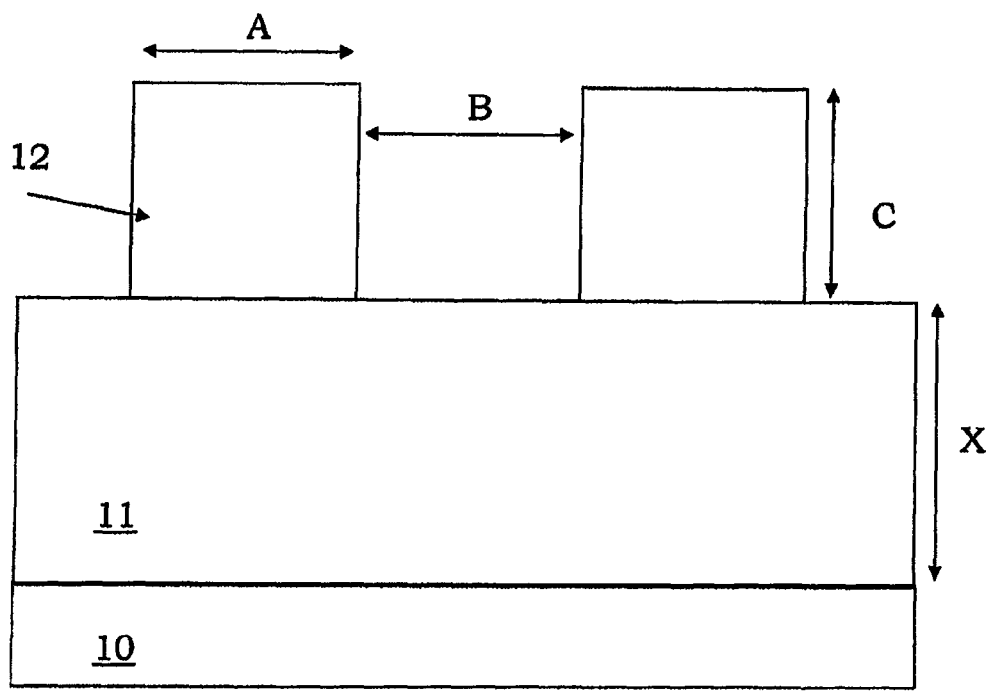
FIGS. 5 to 14 show vertical sections of a MOSFET transistor during different manufacturing steps of the method according to the invention.
Figure 6:
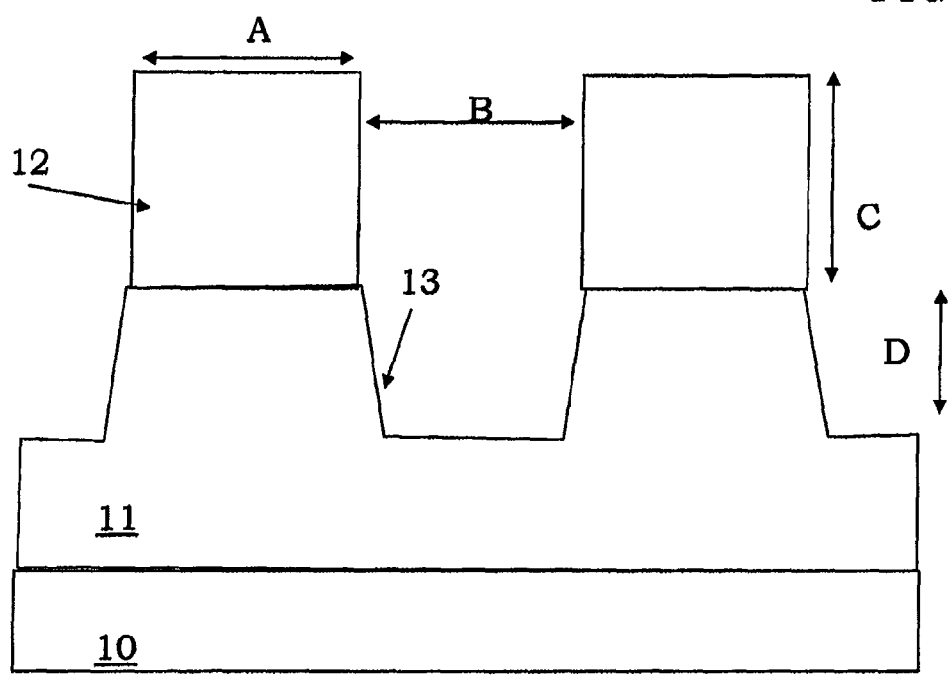

With reference to such figures, a method is described for manufacturing electronic devices integrated on a semiconductor substrate.

The method steps hereafter described do not form a complete flow of the process for the manufacturing of integrated circuits. The present invention can be put into practice together with the techniques for manufacturing integrated circuits currently used in the field, and only those commonly used process steps being necessary for the comprehension of the present invention are included in the description.

The figures showing transversal sections of an integrated electronic device portions during the manufacturing are not drawn to scale, but they are instead drawn so as to show the important characteristics of some embodiments.

With reference to FIGS. 5 to 14, a method for manufacturing a multi-drain vertical power MOSFET transistor is described.

On a semiconductor substrate 10, for example of silicon carbide 4H of a first type of conductivity, in particular of the N type, a first superficial semiconductor layer 11 is formed, for example also of silicon carbide grown by epitaxy.

Advantageously, the first semiconductor substrate 11 has such a thickness X that the final device can withstand a breakdown voltage equal to 600 V, for example equal to 4 μm, with a concentration comprised for example between $9 \times 10^{14}$ at/cm$^3$ and $5 \times 10^{16}$ at/cm$^3$, preferably between $1 \times 10^{16}$ at/cm$^3$ and $5 \times 10^{16}$ at/cm$^3$.

On the first semiconductor layer 11, a first mask 12 is formed, for example comprising strips having a width A and placed at a distance B from one another and having a thickness C. The width A is for example equal to 3 μm and the distance B is equal to 3 μm while the thickness is equal to 3 μm.

An etching step is then carried out of the first semiconductor layer 11, for example of the dry type for forming trench regions in the semiconductor layer 11.

Advantageously, the trench regions 13 have tapered walls and they have a depth D equal to, for example, 2.5 μm.

Figure 7:
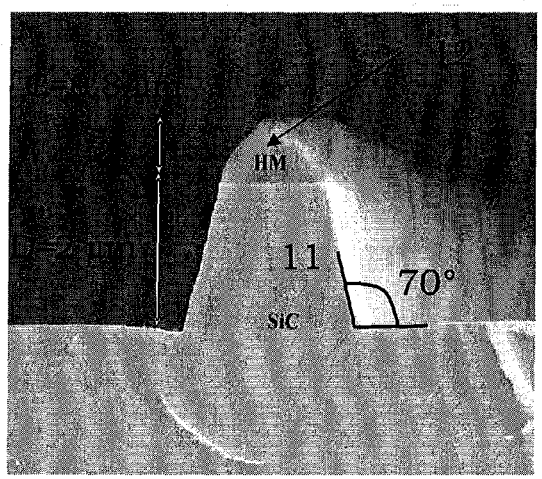
Figure 8:
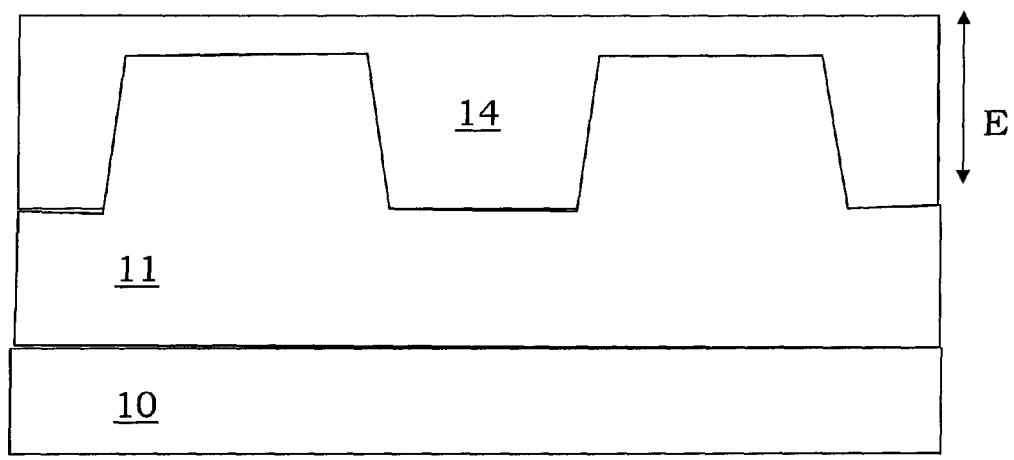

In particular, in the embodiment shown in FIG. 7, after the etching step of the first semiconductor layer 11, the depth of the trench regions 13 is equal to 2 μm, the thickness of the first mask 12 is equal to 0.8 μm, while the side walls of the trench regions 13 thus obtained have an inclination with respect to a bottom surface thereof equal to 70°.

Once the first mask 12 is removed, the trench regions 13 are filled in, for example by epitaxial growth of a second semiconductor layer 14 of a second type of conductivity, in particular of the P type, for example also in silicon carbide, with a concentration comprised between $2 \times 10^{15}$ at/cm$^3$ and $2 \times 10^{17}$ at/cm$^3$, preferably between $2 \times 10^{16}$ at/cm$^3$ and $1 \times 10^{17}$ at/cm$^3$.

Such second semiconductor layer 14 possibly covers also the whole first semiconductor layer 11 of the N type.

For example, after the growth step of the second semiconductor layer 14, its highest thickness, i.e., the distance E between the bottom surface of the trench regions 13 and the upper surface of the second semiconductor layer 14 of the P type, is equal to 3 μm.

Advantageously, the second semiconductor layer 14 of the P type has a charge concentration which compensates an N charge concentration which forms the first semiconductor layer 11.

Figure 9:
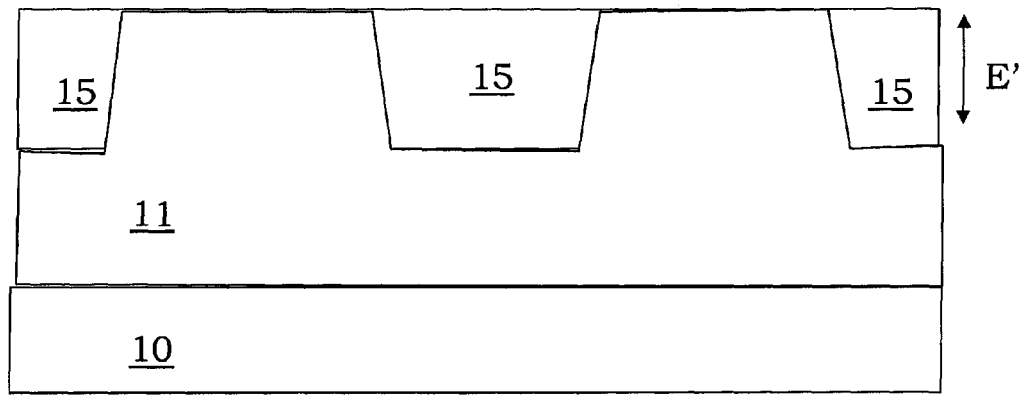

A chemical-mechanical cleaning step is then carried out for removing a surface portion of the second semiconductor layer 14 of the P type until surface portions of the first semiconductor layer 11 are exposed, as shown in FIG. 9.

In the first semiconductor layer 11 of the N type semiconductor portions 15 of the P type are then formed, with a thickness E' for example equal to 2.2 μm.

At this point, on the first semiconductor layer 11 of the N type and aligned with the semiconductor portions 15 of the P type, a power vertical MOS transistor is formed for example of the multi-drain type.

Figure 10:
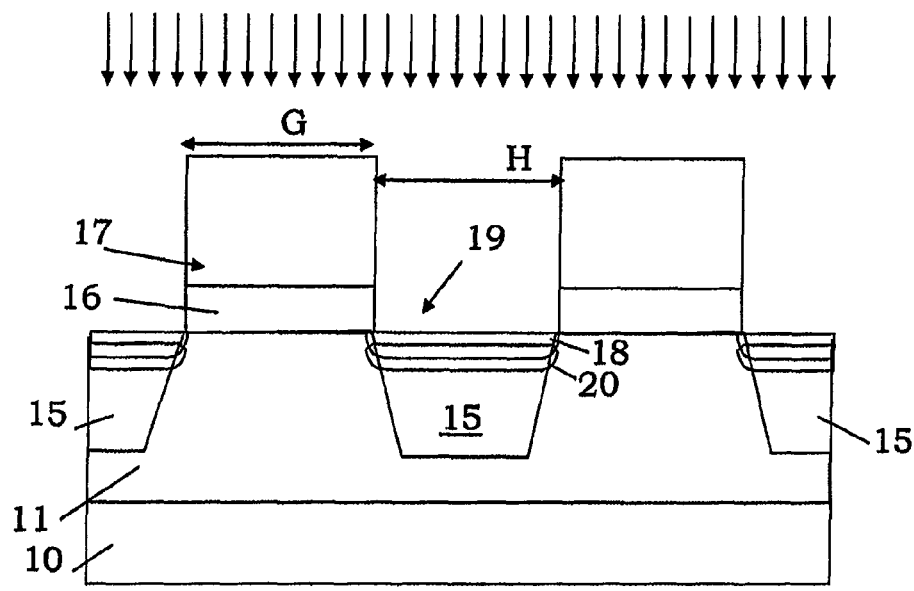

For example, as shown in FIG. 10, on the first semiconductor layer 11, a first dielectric layer 16 is formed, for example by means of deposition of about 5000 Å of TEOS, or growth of a thin silicon oxide layer followed by a deposition of silicon nitride of about 1000 Å and by one of TEOS of about 5000 Å.

By means of a photolithographic process including the use of a resist mask 17, elementary strips are defined in the resist mask 17 with a thickness S for example equal to 4 μm.

The dielectric layer 16 is then selectively etched for forming thick dielectric strips of width G, spaced from one another by a distance H, always indicated with 16. Such dielectric strips 16 are formed on portions of the first semiconductor layer 11 wherein there are no semiconductor regions 15.

Advantageously, the side walls of the thick dielectric strips 16 are aligned to the semiconductor portions 15 thus, their width H is equal to the width A of the strips composing the first mask 12.

Such dielectric strips 16 act as a screening structure for portions of the first semiconductor layer 11 during successive implantation steps.

Nothing forbids that the portions of the first semiconductor layer 11 left exposed by the dielectric strips 16 have a different shape with respect to those of elementary strips and are of polygonal shape or of other suitable shape.

The method goes on, thus as shown in FIG. 10, with a first ion implantation, for example of the P type, suitable to form a first portion 18 of a body well 19 for the formation of the channel region aligned to the semiconductor portions 15. Advantageously, the first portions 18 of body wells 19 are aligned with the semiconductor portions 15.

Such first ion implantation of the P type is formed for example with boron or aluminum ions and with a concentration which varies between $1 \times 10^{13}$ at/cm$^2$ and $1 \times 10^{14}$ at/cm$^2$ and an implant energy 30-80 keV.

Advantageously, a second ion implantation step of the P type is carried out suitable to form a second deep portion 20 of the body well 19 to withstand a suitable electric field during the cut-off step and to reduce the gain of parasite transistors which are formed in the first semiconductor layer 11. Advantageously, the second deep portions 20 of body wells 19 are aligned with the semiconductor portions 15, as shown in FIG. 10.

In particular, this second deep portion 20 of the body well 19 is aligned to the first portion 18 and it is formed at a greater depth. Such second ion implantation of the P type is then carried out for example with boron or aluminum ions with a concentration which varies between $5 \times 10^{13}$ at/cm$^2$ and $5 \times 10^{14}$ at/cm$^2$ and an implant energy 300-500 keV.

Once the resist mask 17 is removed, a deposition or growth step is advantageously carried out of a stopping layer for a successive etching, for example 50-500 Å of silicon oxide or nitride, not shown in the figures.

Figure 11:
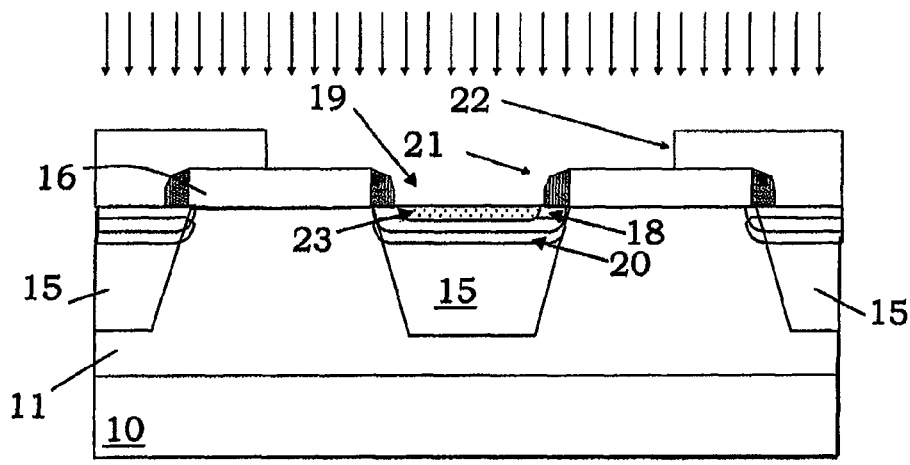

A sacrificial layer of suitable thickness is then deposited for the formation of implant spacers 21, for example 3000-7000 Å of polysilicon, as shown in FIG. 11. It is to be noted that the thickness of the sacrificial layer determines the channel length of the MOS device, as it will be clear hereafter.

An etching step is then formed, for example of the dry type, of the sacrificial layer to form spacers 21 on the side walls of the thick dielectric strips 16, as shown in FIG. 11.

Advantageously, by means of a photolithographic process which includes the use of a second resist mask 22, the whole first semiconductor layer 11 is covered except for areas aligned to the portions of the semiconductor layer 11 wherein source regions will be formed.

A first ion implantation step of the N type is then carried out suitable to form a source region 23 inside the body region 19. Such first ion implantation of the N type is formed for example with phosphorus, nitrogen or aluminum ions with a concentration which varies between $5 \times 10^{14}$ at/cm$^2$ and $5 \times 10^{15}$ at/cm$^2$ and an implant energy 30-80 keV.

Once a removal step of the implant spacers 21 is carried out, for example in wet by dipping, into a solution of KOH, advantageously, a single activation thermal process of the dopant species is carried out for completing the implanted regions 18, 20 and 23.

Such activation thermal process is carried out at a temperature, for example comprised between 1400 and 1600° C., for a time comprised between 15 min and 5 hours. It is to be underlined the fact that such activation thermal process is carried out so as to allow only the activation and not the diffusion of the dopant species, in particular it is a process with low thermal budget.

An etching and removal step of the stopping layer, if previously formed, is then carried out.

Figure 12:
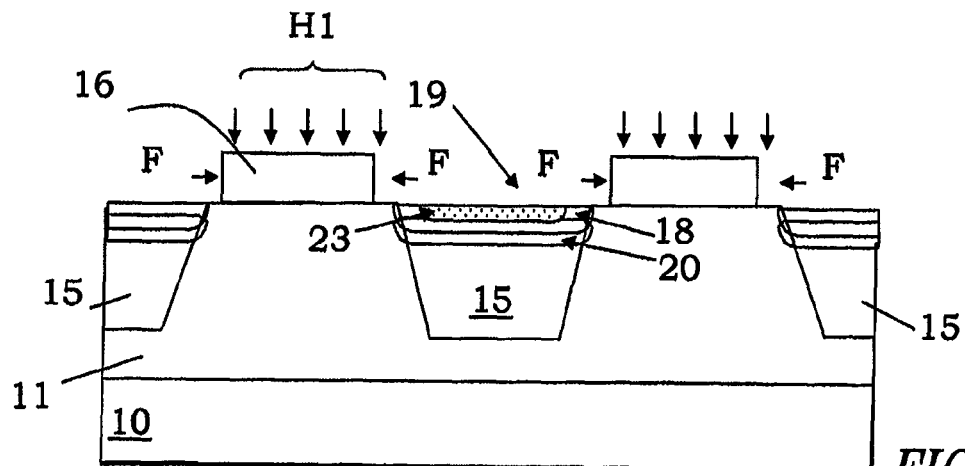

Advantageously, as shown in FIG. 12, the method thus comprises an etching step, for example of the timed wet type, of the thick dielectric strips 16 so as to reduce their width from H to H1 and thus make them go back with respect to the body well 23.

Figure 13:
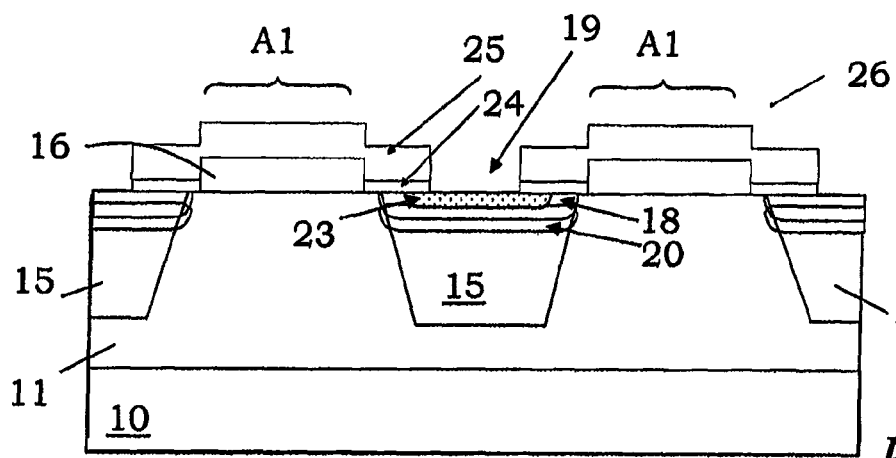

Once a cleaning step of the surface of the device is carried out, a thin dielectric layer 24 is formed on the whole device, for example a silicon oxide layer followed by a deposition of 500-1000 Å of TEOS, as shown in FIG. 13.

A conductive layer 25 is then formed, for example of suitably doped polysilicon, for the formation of gate structures 26.

By means of a photolithographic process which includes the use of a third resist mask and successive etching step of the conductive layer 25 and of the dielectric layer 24 a gate loop 26 is thus defined, as shown in FIG. 13, so that the gate structures 26 are partially overlapped onto the body wells 19 and insulated therefrom by means of the thin dielectric layer 24 and are thus substantially aligned to the source regions 23.

In such way, in the final device the gate structures 26 are insulated from the semiconductor layer 11 by means of a dielectric layer 16, 24 which comprises a first portion formed by the strips 16 having a first thickness and by a second portion formed by the dielectric layer 24 of a second thickness lower than the first thickness.

Figure 14:
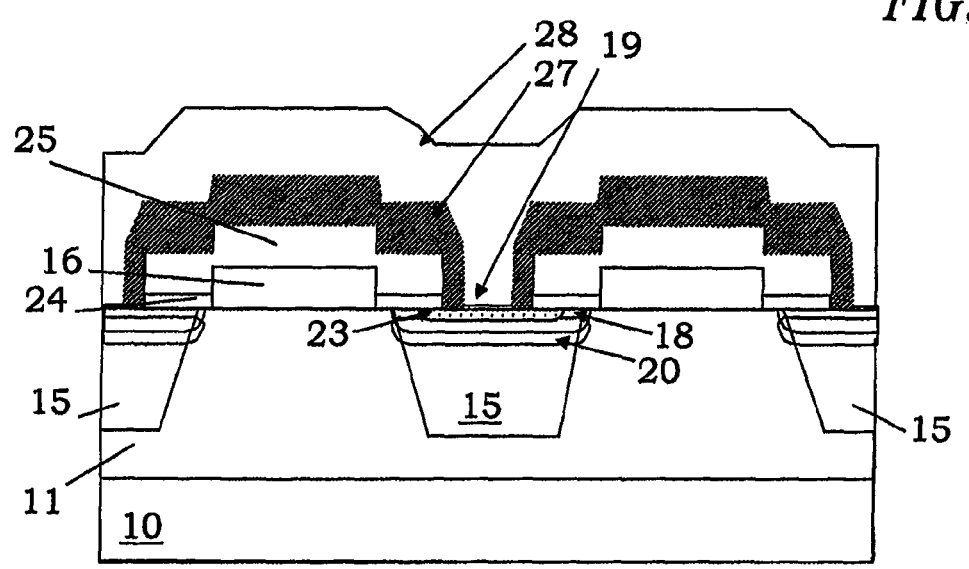

The device is then completed by means of conventional process steps including:

a covering step with a dielectric layer 27 wherein openings are formed for the contacts as shown in FIG. 14;

a formation step of a metallization layer 28 and thus a finishing one of the back of substrate 10.

Although in the description reference has been made to silicon carbide semiconductor layers, the method according to the invention can be validly used for forming power MOS devices integrated on semiconductor substrates formed in semiconductor materials with wide band gap, i.e., with a band gap energetic value Eg greater than that of the silicon which is equal to 1.1 eV. In fact, such power MOS devices formed with semiconductor materials having wide band can withstand a critical electric field Ec higher than $1 \times 10^6$ V/cm and thus a high breakdown voltage BV.

Therefore, such power MOS devices are also advantageously able to manage high voltages, still maintaining a particularly contained thickness of the drain layer.

In particular, the manufacturing method according to the invention allows to form power devices integrated on a silicon carbide substrate able to withstand a higher breakdown voltage BV (higher than 600 V) with respect to that of the devices formed according to the prior art.

In conclusion, the device thus formed is a power MOS transistor of the multi-drain type which is compact and which exhibits a very low output voltage, wherein the semiconductor layer 11 forms a drain layer common by a plurality of elementary units forming the final MOS power device. Each elementary unit comprises a body well 19 below which the semiconductor regions 15 are formed which realize, for the final device, the same characteristics of the column regions formed in the power transistors described with reference to the prior art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical power MOS device, comprising:
a semiconductor substrate of a first type of conductivity;
a semiconductor portion of a second type of conductivity positioned in said semiconductor substrate;
an implanted body region of the second type of conductivity positioned within the semiconductor portion;
a doped source region of the first type of conductivity formed inside said implanted body region;
first and second dielectric portions positioned on opposite side portions of the semiconductor portion and on opposite side portions of the source region; and
first and second gate structures projecting from said substrate and insulated from the doped source region and the body region by the dielectric portions.

2. The power MOS device of claim 1, wherein said semiconductor portion is an epitaxial portion.

3. The power MOS device of claim 1 wherein each of said dielectric portions comprises a first portion of a first thickness and a second portion of a second thickness lower than said first thickness, said gate structure being partially overlapped onto said doped body region and insulated therefrom by said portion of said dielectric layer and substantially aligned to said source region.

4. The power MOS device of claim 1 wherein said semiconductor substrate includes a base substrate and an epitaxial semiconductor layer on said base substrate.

5. The power MOS device of claim 1 wherein said semiconductor substrate and said semiconductor portion are of silicon carbide.

6. The power MOS device of claim 1, wherein the substrate has a first charge concentration and the semiconductor portion has a second charge concentration that balances said first charge concentration.

7. The power MOS device of claim 1, wherein the semiconductor portion has tapered sidewalls, upper portions of the sidewalls being separated from each other by a first distance, and lower portions of the sidewalls being separated from each other by a second distance that is smaller than the first distance.

8. A vertical power MOS device, comprising:
a semiconductor substrate having a first charge concentration of a first type of conductivity;
a doped body region of a second type of conductivity;
a doped source region of the first type of conductivity formed inside said doped body region;
a dielectric layer;
a gate structure projecting from said substrate and insulated from the substrate by the dielectric layer;
a semiconductor portion positioned below said doped body region, the semiconductor portion having tapered walls with a second charge concentration of said second type of conductivity, said second charge concentration balancing said first charge concentration.

9. A power MOS device according to claim 8, wherein said dielectric layer comprises a first portion of a first thickness and a second portion of a second thickness lower than said first thickness, said gate structure being partially overlapped onto said doped body region and insulated from the doped body region by said second portion of said dielectric layer and substantially aligned to said doped source region.

10. A power MOS device according to claim 8, wherein said semiconductor portion has maximum depth and a maximum length greater the maximum depth.

11. A power MOS device according to claim 8, wherein the semiconductor portion is an epitaxial region.

12. A power MOS device according to claim 8, wherein the substrate includes an epitaxial layer, the body region and the semiconductor portion being positioned in the epitaxial layer.

13. A power MOS device according to claim 12, wherein the substrate, epitaxial layer, and semiconductor are of silicon carbide.

14. A power MOS device according to claim 8, wherein said first charge concentration is between $9 \times 10^{14}$ at/cm$^3$ and $5 \times 10^{16}$ at/cm$^3$ and said second charge concentration is between $2 \times 10^{15}$ at/cm$^3$ and $2 \times 10^{17}$ at/cm$^3$.

* * * * *